(12) United States Patent
Tu et al.

(10) Patent No.: US 12,396,203 B2
(45) Date of Patent: Aug. 19, 2025

(54) SEMICONDUCTOR STRUCTURE HAVING A SOURCE/DRAIN EPITAXIAL STACK WITH A NON-CRYSTALLINE LAYER THEREIN

(71) Applicant: TAIWAN SEMICONDUCTOR MANUFACTURING CO., LTD., Hsinchu (TW)

(72) Inventors: Wen-Hsien Tu, Hsinchu (TW); Wei-Fan Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 52 days.

(21) Appl. No.: 17/876,638

(22) Filed: Jul. 29, 2022

(65) Prior Publication Data

US 2022/0376067 A1   Nov. 24, 2022

Related U.S. Application Data

(62) Division of application No. 16/901,603, filed on Jun. 15, 2020, now Pat. No. 11,600,728.

(51) Int. Cl.
| | |
|---|---|
| *H01L 29/78* | (2006.01) |
| *H01L 21/02* | (2006.01) |
| *H01L 29/04* | (2006.01) |
| *H01L 29/08* | (2006.01) |
| *H01L 29/417* | (2006.01) |

(Continued)

(52) U.S. Cl.
CPC ....... *H10D 30/62* (2025.01); *H01L 21/02609* (2013.01); *H10D 30/024* (2025.01); *H10D 30/6211* (2025.01); *H10D 30/6219* (2025.01); *H10D 30/797* (2025.01); *H10D 62/021* (2025.01); *H10D 62/151* (2025.01); *H10D 62/405* (2025.01); *H10D 64/021* (2025.01);

(Continued)

(58) Field of Classification Search
CPC ..... H01L 21/823431; H01L 21/823821; H01L 21/845; H01L 27/0886; H01L 27/0924; H01L 27/1211; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/823418; H01L 21/823814; H01L 21/823425; H01L 29/0847; H01L 29/66636; H01L 29/66575; H01L 29/7848; H01L 29/04; H01L 29/045; H01L 21/02609; H10B 12/36; H10B 12/056
See application file for complete search history.

(56) References Cited

U.S. PATENT DOCUMENTS 9,105,490 B2   8/2015   Wang et al.
9,236,267 B2   1/2016   De et al.
(Continued)

*Primary Examiner* — Younes Boulghassoul
(74) *Attorney, Agent, or Firm* — Sterne, Kessler, Goldstein & Fox P.L.L.C.

(57) ABSTRACT

The present disclosure is directed to source/drain (S/D) epitaxial structures with enlarged top surfaces. In some embodiments, the S/D epitaxial structures include a first crystalline epitaxial layer comprising facets; a non-crystalline epitaxial layer on the first crystalline layer; and a second crystalline epitaxial layer on the non-crystalline epitaxial layer, where the second crystalline epitaxial layer is substantially facet-free.

20 Claims, 6 Drawing Sheets

(51) Int. Cl.
*H10D 30/01* (2025.01)
*H10D 30/62* (2025.01)
*H10D 30/69* (2025.01)
*H10D 62/00* (2025.01)
*H10D 62/13* (2025.01)
*H10D 62/40* (2025.01)
*H10D 64/01* (2025.01)
*H10D 84/01* (2025.01)
*H10D 84/03* (2025.01)

(52) U.S. Cl.
CPC ....... *H10D 84/013* (2025.01); *H10D 84/0158* (2025.01); *H10D 84/038* (2025.01)

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,666,691 B2 | 5/2017 | Su et al. |
| 9,831,183 B2 | 11/2017 | Lin et al. |
| 9,859,386 B2 | 1/2018 | Ho et al. |
| 10,510,607 B1 | 12/2019 | Lin et al. |
| 11,600,728 B2 | 3/2023 | Tu et al. |
| 2015/0091086 A1 | 4/2015 | Lu et al. |
| 2015/0214051 A1* | 7/2015 | Kim .................. H01L 21/02609 438/494 |
| 2016/0087063 A1* | 3/2016 | Yin .................. H01L 21/823412 438/283 |
| 2017/0133386 A1 | 5/2017 | Lee et al. |
| 2017/0154990 A1* | 6/2017 | Sung .................. H01L 21/30604 |
| 2017/0154996 A1* | 6/2017 | Lin .................. H01L 21/02057 |
| 2018/0175172 A1 | 6/2018 | Chang et al. |
| 2018/0342583 A1 | 11/2018 | Yu et al. |
| 2019/0164966 A1* | 5/2019 | Wang .................. H01L 29/7853 |
| 2020/0020773 A1* | 1/2020 | Choi .................. H01L 29/0847 |
| 2020/0043793 A1 | 2/2020 | Huang |
| 2020/0075724 A1* | 3/2020 | Wang .................. H01L 29/401 |
| 2020/0091011 A1* | 3/2020 | Khaderbad ..... H01L 21/823871 |
| 2020/0105932 A1* | 4/2020 | Li .................. H01L 29/36 |
| 2020/0111789 A1 | 4/2020 | Li |
| 2020/0119006 A1 | 4/2020 | Lee et al. |
| 2020/0135914 A1 | 4/2020 | Lin et al. |
| 2020/0168723 A1* | 5/2020 | Hsu .................. H10B 10/12 |
| 2020/0168735 A1 | 5/2020 | Yu et al. |
| 2020/0176565 A1* | 6/2020 | Ting .................. H01L 21/0262 |
| 2021/0391454 A1 | 12/2021 | Tu et al. |

* cited by examiner

200

- 210: Form fins on a substrate, where the fins are spaced apart by an isolation layer that covers a bottom portion of the fins
- 220: Form fin spacer structures on sidewall surfaces of the fins
- 230: Etch the fins between the fin spacer structures to recess the fins with respect to the isolation layer
- 240: Grow a first epitaxial layer on the recessed fins between the fin spacer structures
- 250: Deposit an amorphous or polycrystalline layer on surfaces of the first epitaxial layer not covered by the fin spacer structures
- 260: Grow a second epitaxial layer on the amorphous or polycrystalline layer

Fig. 2

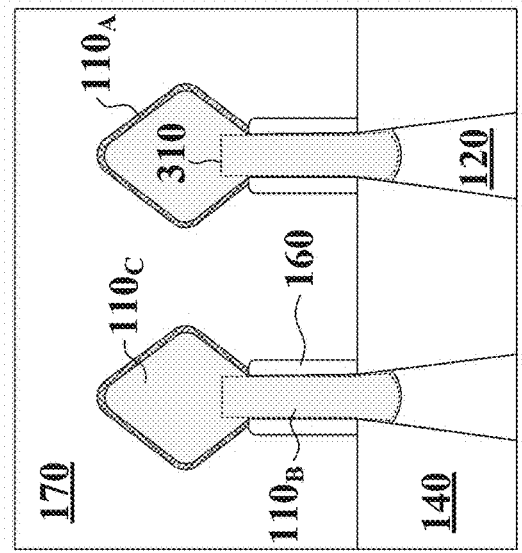
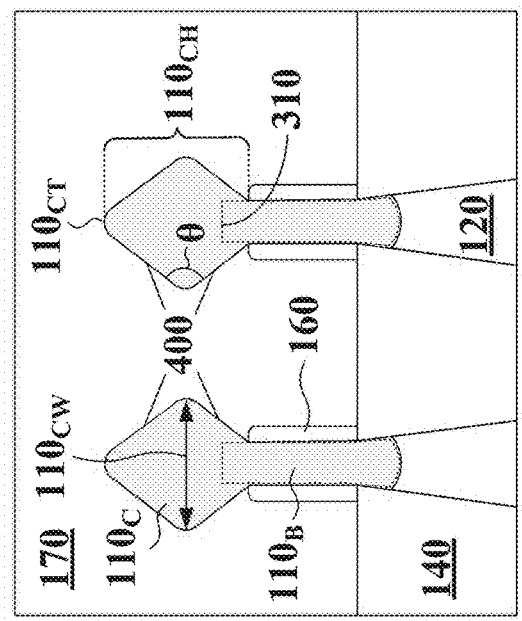
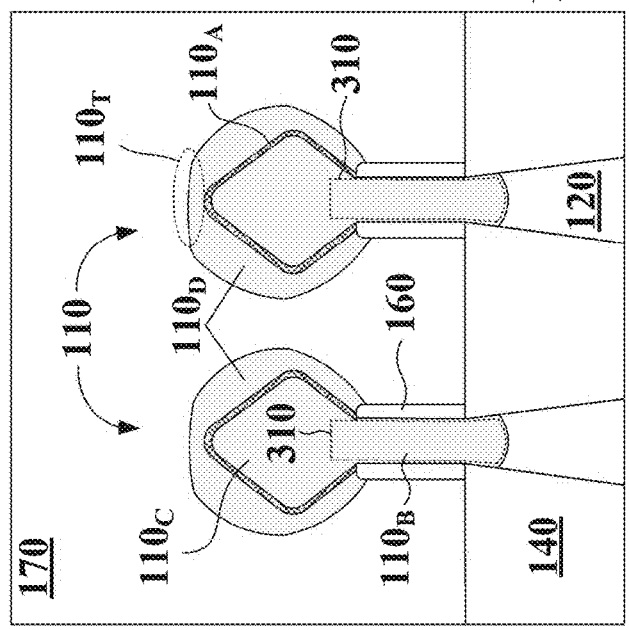
Fig. 4A
Fig. 4B
Fig. 4C

SEMICONDUCTOR STRUCTURE HAVING A SOURCE/DRAIN EPITAXIAL STACK WITH A NON-CRYSTALLINE LAYER THEREIN

CROSS-REFERENCE TO RELATED APPLICATIONS

This application is a divisional of U.S. patent application Ser. No. 16/901,603, titled "Source and Drain Epitaxial Layers," filed on Jun. 15, 2020, which is incorporated herein by reference in its entirety.

BACKGROUND

The source and drain contact resistance in fin-based field effect transistors can be inversely proportional to the interfacial area between the source/drain contacts and underlying epitaxial layers of the source/drain terminals. In other words, the smaller the interfacial area between the source/drain contacts and the underlying source/drain epitaxial layers, the higher the source/drain contact resistance. Epitaxial layer growth on a fin can be based on a crystallographic orientation of the fin's surfaces such that epitaxially-grown source/drain regions may result in a top surface with limited surface area for the source/drain contacts.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIG. 2 is a flowchart of a method for forming source/drain epitaxial stacks with an enlarged top surface, in accordance with some embodiments.

FIGS. 3A-4C are cross-sectional views of a fabrication sequence for forming source/drain epitaxial stacks with an enlarged top surface, in accordance with some embodiments.

DETAILED DESCRIPTION

Figure 1:
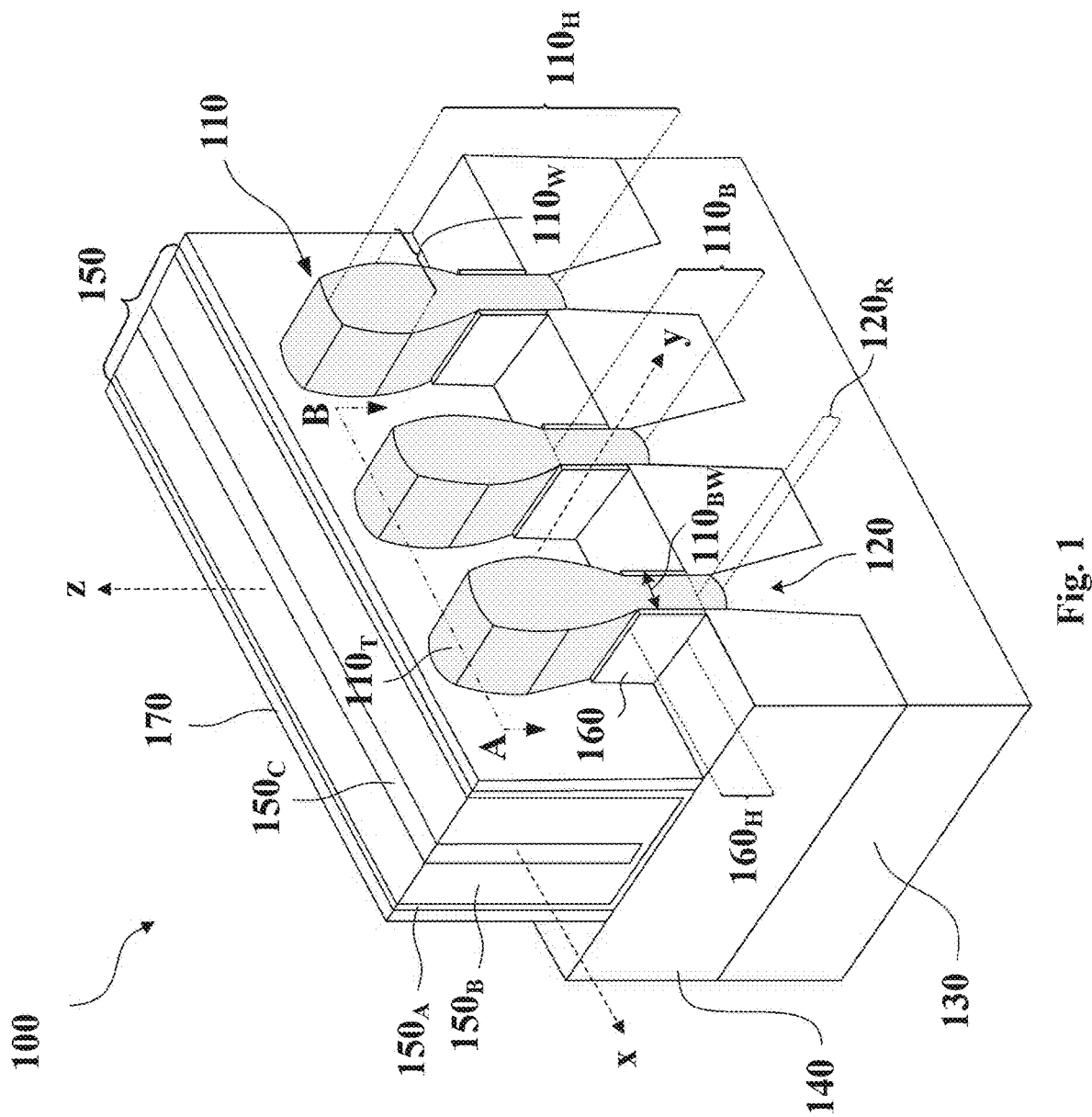
FIG. 1 is an isometric view of a three-fin FET structure with source/drain epitaxial structures having an enlarged top surface, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, +2%, +3%, +4%, +5% of the value).

The term "vertical," as used herein, means nominally perpendicular to the surface of a substrate.

In fin-based field effect transistors (e.g., finFETs), epitaxial layers of the source/drain (S/D) terminals are grown on crystalline fins formed on a substrate. Consequently, contacts for the S/D terminals can be formed by forming a conductive structure (e.g., a S/D contact) on the top surface of the S/D epitaxial layers. The resistance of the S/D contact can be reduced if the contact area between the bottom of the S/D contact and the top surface of the SID epitaxial layers is as large as possible. Achieving a large contact area between the bottom of the S/D contact and the top surface of the S/D epitaxial layers can be challenging. For example, during the S/D epitaxial layer deposition, some silicon crystallographic orientations favor (or promote) the epitaxial layer growth more than others. This can result to a final epitaxial structure that has a "diamond" shape with facets parallel to the {111} silicon crystal planes. The diamond shaped SID epitaxial stack has an edge-like structure for a top surface, where the {111} facets meet along the length of the fin. Consequently, the available contact area between the SID contact and the diamond shaped S/D epitaxial structure is limited by the width of the edge-like structure.

One way to increase the available contact area between the S/D contact and the diamond shaped SID epitaxial structure is to over-etch the top surface of the diamond shaped S/D epitaxial structure when forming the S/D opening. This allows the S/D contact to be formed "deeper" into the S/D epitaxial structure, effectively increasing the contact area. However, this approach has disadvantages. For example, over-etching can compromise the stress induced to the channel region by the S/D epitaxial structure and negatively impact the transistor's performance. Further, over-etching may suffer from process variation due to loading effects or other structure related issues, such as height variation between the S/D epitaxial structures. As a result, some of the S/D contacts may be shallower than others. Therefore, the contact area between the bottom of the S/D contacts and the top surface of the S/D epitaxial layers may substantially vary across the transistors.

To address these challenges, the embodiments described herein are directed to forming S/D epitaxial structures with enlarged top surface which increases the effective contact area between the S/D contact and the S/D epitaxial structure. In some embodiments, a polycrystalline or amorphous layer having a thickness between about 3 nm and about 5 nm can be introduced to inhibit the diamond-like growth of the S/D epitaxial structure and to promote the formation of bulk-like shape that includes an enlarged top surface. In some embodiments, more than one polycrystalline or amorphous layers can be introduced during the S/D epitaxial layer growth. The S/D epitaxial structures described herein can be suitable for both p-type FETs (PFETs) and n-type FETs (NFETs). The S/D epitaxial structures formed with the methods described herein can induce additional stress to the transistor's channel region compared to conventional diamond-shaped S/D epitaxial structures, in which such additional stress improves transistor performance. In some embodiments, the polycrystalline or amorphous layer for S/D epitaxial structures used in PFETs can include boron-doped (B-doped) silicon-germanium (SiGe), B-doped germanium (Ge), B-doped germanium-tin (GeSn), or combinations thereof. The polycrystalline or amorphous layer for S/D epitaxial structures used in NFETs can include arsenic (As) or phosphorous (P)-doped silicon (Si), carbon-doped silicon (Si:C), or combinations thereof.

FIG. 1 is an isometric view of a three-fin FET structure 100 featuring S/D epitaxial structures 110 with an enlarged top surface $110_T$, according to the embodiments described herein. S/D epitaxial structures 110 are formed on recessed portions of fins 120, which are in turn formed in contact with substrate 130. Fins 120 are isolated from each other via an isolation layer 140. FinFET structure 100 further includes a gate stack 150 formed over non-recessed portions of fins 120 so that S/D epitaxial structures 110, when formed, are abutting the sidewalls of gate stack 150. In some embodiments, S/D contacts can be formed on top surfaces $110_T$ of S/D epitaxial structures 110. S/D contacts are not shown in FIG. 1 for simplicity.

In some embodiments, S/D epitaxial structures 110 include two or more epitaxially-grown layers and one or more polycrystalline or amorphous layers responsible for the shape of S/D epitaxial structures 110 and the formation of the enlarged top surface $110_T$. These layers are not shown in FIG. 1 for simplicity. In some embodiments, the aforementioned polycrystalline or amorphous layers inhibit the facet formation during the growth of S/D epitaxial structure 110. S/D epitaxial structures 110 can develop a more rounded profile and enlarged top surface $110_T$ compared to the diamond shaped S/D epitaxial structures formed without the use of one or more polycrystalline or amorphous layers.

As discussed earlier, S/D epitaxial structures 110 are formed on recessed portions of fins 120 not covered by gate stack 150. During the initial stages of the epitaxial growth, the S/D epitaxial layers of S/D epitaxial structures 110 are confined by fin spacer structures 160. Hence, a bottom portion 110E of S/D epitaxial structures 110 is grown upwards with the lateral growth being bounded by fin spacer structures 160. In some embodiments, fin spacer structures 160 are formed prior to recessing fins 120 and have a height $160_H$ that ranges between about 10 nm and about 18 nm. In some embodiments, fins 120 are recessed below the top surface of isolation layer 140 by a recess amount $120_R$ ranging between about 5 nm and about 10 nm.

Once the S/D epitaxial layers are grown beyond the confinement on fin spacer structures 160, lateral growth (e.g., along the x-axis) resumes as shown in FIG. 1. In some embodiments, height $110_H$ of S/D epitaxial structures 110 ranges from about 90 nm to about 95 nm, and width $110_W$ of S/D epitaxial structures 110 ranges from about 25 nm to about 32 nm. Width $110_{BW}$ of bottom portion $110_B$ of S/D structure 110 ranges from about 5 nm to about 10 nm.

Fins 120 may be formed via patterning by any suitable method. For example, fins 120 may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, fins 120 may be formed from the same material as substrate 130. However, this is not limiting. By way of example and not limitation, fins 120 and substrate 130 can include (i) crystalline Si; (ii) Ge; (iii) a compound semiconductor including silicon carbide, gallium arsenide (GaAs), gallium phosphide (GaP), indium phosphide (InP), indium arsenide (InAs), and/or indium antimonide (InSb); (iv) an alloy semiconductor including SiGe, gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (v) any combinations thereof. Substrate 130 and fins 120 are described in FIG. 1, and in subsequent figures, in the context of crystalline Si. Based on the disclosure herein, other materials, as discussed above, can be used. These materials are within the spirit and scope of this disclosure.

In FIG. 1, gate stack 150 can include additional layers, such as a gate dielectric stack 150A, work function stack $150_B$, and metal fill $150_C$. Further, the sidewalls of gate stack 150 are covered by gate spacers 170. Gate spacers 170 are interposed between the sidewalls of gate stack 150 and S/D epitaxial structures 110. In some embodiments, gate spacers 170 include one or more layers of dielectric material that isolates gate stack 150 from S/D epitaxial structures 110. Fins 120 can have non-recessed portions (not visible in FIG. 1) covered by gate stack 150.

According to some embodiments, FIG. 2 is a flow chart of a method 200 that describes the fabrication process of S/D epitaxial structures 110 shown in FIG. 1. Other fabrication operations may be performed between the various operations of method 200 and may be omitted merely for clarity. Further, the fabrication operations of method 200 are not unique and alternative operations may be performed in place of the operations in method 200. Embodiments of the present disclosure are not limited to method 200. Exemplary method 200 will be described with respect to FIGS. 3A-D and 4A-C.

Figure 3A:
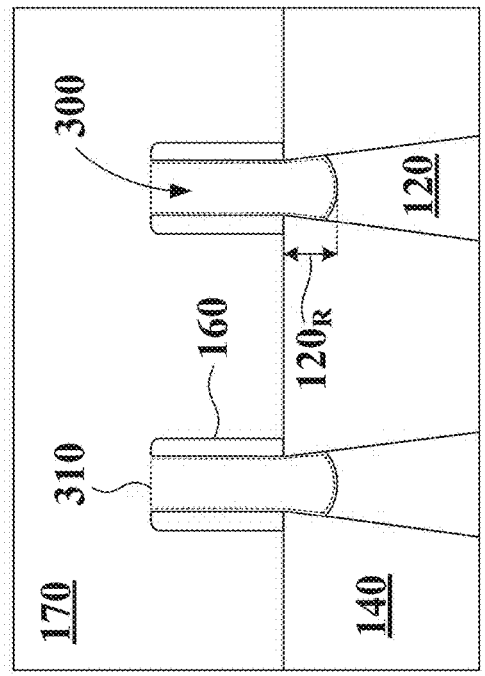

Referring to FIG. 2, method 200 begins with operation 210 and the process of forming fins on a substrate. The fins are spaced apart by an isolation layer that covers a bottom portion of the fins. By way of example and not limitation, the structure described in operation 210 can be similar to the structure shown in FIG. 3A. In some embodiments, FIG. 3A is a cross-sectional view of a precursor structure of three-finFET structure 100 shown in FIG. 1 along cut line AB. For ease of description, common elements between FIG. 1 and the subsequent figures will share the same reference numerals. In FIG. 3A, fins 120 and isolation layer 140 formed on substrate 130 correspond respectively to the fins, the isolation layer, and the substrate as described in operation 210.

Fins 120 may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. In some embodiments, a sacrificial layer (not shown in FIG. 1) can be formed over substrate 130 and patterned using a photolithography process. Spacers (not shown in FIG. 1) are formed alongside the patterned sacrificial layer using a self-aligned process. The sacrificial layer is then removed, and the remaining spacers may then be used to pattern the fins.

Once fins 120 are formed, isolation layer 140 can be deposited on fins 120 and substrate 130, planarized, and subsequently recessed with respect to fins 120 using an isotropic etching process as shown in FIG. 3A. In some embodiments, and after the aforementioned recess operation, fin 120 has a height $120_H$ above recessed isolation layer 140 between about 30 nm and about 35 nm. Further, fin 120 has a width $120_W$ between about 3.5 nm and 5 nm.

Referring to FIG. 2, method 200 continues with operation 220 and the process of forming fin spacer structures 160 on each fin 120 as shown in FIG. 1. By way of example and not limitation, fin spacer structures 160 can be formed as follows. Referring to FIG. 3A, fin spacer material 160' is deposited on fins 120 and isolation layer 140. Subsequently, fin spacer material 160' is etched using an anisotropic etching process to remove fin spacer material 160' faster on horizontal surfaces (e.g., the top surfaces of fins 120 and isolation layer 140) than on vertical surfaces (e.g., the sidewalls of fins 120). As a result, referring to FIG. 3B, the remaining fin spacer material 160' on the sidewalls of fins 120 forms fin spacer structures 160. By way of example and not limitation, the thickness of fin spacer structures 160 is less than that of the as-deposited fin spacer material 160' due to the nature of the anisotropic etching process. In some embodiments, the thickness of fin spacer structures 160 ranges between about 3 nm and 5 nm. By way of example and not limitation, fin spacer material 160' can include a nitride (e.g., silicon nitride, silicon carbon nitride, silicon oxy-nitride, etc.) that can be selectively etched with respect to fins 120 (e.g., silicon) and isolation layer 140 (e.g., a silicon oxide based dielectric).

Figure 3C:
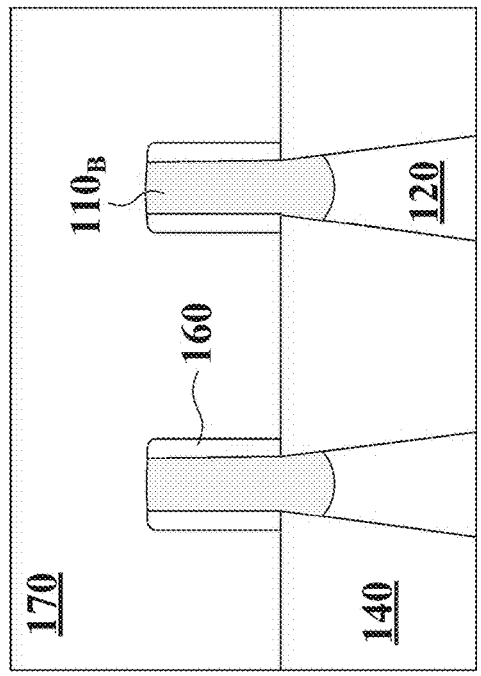
Figure 3B:
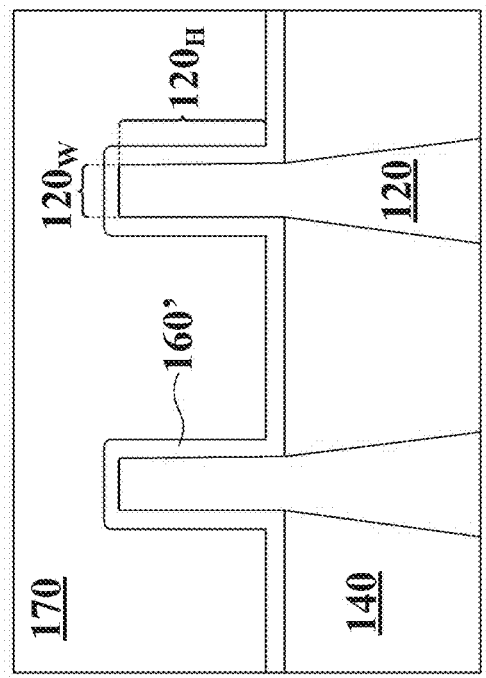

Referring to FIG. 2, method 200 continues with operation 230 and the process of etching fins 120 between fin spacer structures 160 to recess fins 120 with respect to isolation layer 140 as shown in FIG. 3C and similarly in FIG. 1. In some embodiments, the portion of fins 120 covered by gate stack 150 and gate spacers 170 shown in FIG. 1 is not recessed. In some embodiments, the etching chemistry used for recessing fins 120 not covered by gate stack 150 and gate spacers 170 includes chlorine-based or fluorine-based gases which can selectively etch silicon as opposed to nitrides or oxides. As discussed earlier, fins 120 are recessed below the top surface of isolation layer 140 by an amount $120_R$ that can range from about 5 nm to about 10 nm. Once fins 120 are recessed according to operation 230, an opening 300 is formed between fin spacer structures 160 as shown in FIG. 3C. Dashed line 310 corresponds to the un-recessed portion of the fin covered by gate stack 150 and gate spacers 170 shown in FIG. 1.

Figure 3D:
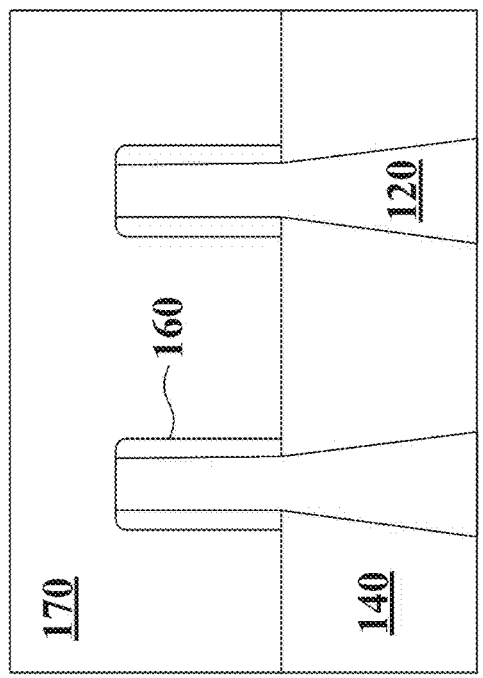

Referring to FIG. 2, method 200 continues with operation 240 and the process of growing a first epitaxial layer on recessed fins 120 between fin spacer structures 160. According to some embodiments, the portion of the first epitaxial layer surrounded by fin spacer structures 160 is "forced" to a vertical growth (e.g., a growth along the z-axis and no lateral growth along the x-axis) as shown in FIG. 3D. The portion of the first epitaxial layer between fin spacer structures 160 corresponds to the bottom portion 110B of S/D epitaxial structure 110 shown in FIG. 1. As the first epitaxial layer grows thicker than the height of fin spacer structures 160, the lateral growth (e.g., along the x-axis) resumes and the first epitaxial layer assumes the shape of a diamond $110_C$ as shown in FIG. 4A. The resulting diamond $110_C$ features facets 400 which are parallel to silicon crystalline planes {111}. In some embodiments, the shape of diamond $110_C$ is the result of a lower growth rate observed for the first epitaxial layer in a direction perpendicular to silicon crystalline planes {111} as compared to a direction perpendicular to silicon crystalline planes {100}(e.g., along the z-axis) and silicon crystalline planes {110}(along the x-axis). If the first epitaxial layer is allowed to grow further, the size of diamond $110_C$ will further increase. By way of example and not limitation, the width to height ratio ($110_{CW}/110_{CH}$) of diamond $110_C$ can be about 1.4 and due to the slower growth in the direction perpendicular to silicon crystalline planes {111}, an angle θ between about 70° and 120° is formed between facets 400.

Diamond $110_C$, in contrast to S/D epitaxial structures 110, has a top surface $110_{CT}$ formed by two adjoining facets 400. Top surface $100_{CT}$ provides limited surface area compared to S/D epitaxial structures 110. Further, top surface $100_{CT}$ does not substantially increase as the first epitaxial layer grows. Therefore, if an S/D contact were to be formed on diamond $100_C$ of first epitaxial layer, the limited "landing" area of top surface $100_{CT}$ would result in a high S/D contact resistance as discussed earlier.

In some embodiments, the first epitaxial layer can include strained Si doped with C (Si:C), Si doped with P (Si:P), or Si doped with As (Si:As) for n-type finFETs. Respectively, the first epitaxial layer can include strained SiGe doped with B, Ge doped with B, or GeSn doped with B. By way of example and not limitation, the amount of P incorporated into the first epitaxial layer for n-type finFETs can be about $3 \times 10^{21}$ atoms/cm$^{-3}$ and the amount of B incorporated into the first epitaxial layer for p-type finFETs can be about $1 \times 10^{21}$ atoms/cm$^{-3}$. In some embodiments, P and B dopants can be incorporated into the first epitaxial layer during growth. By way of example and not limitation, the concentration of C in Si:C can be equal to or less than about 5 atomic % (at. %), and respectively the concentration of Ge in SiGe can be between about 20 at. % and about 40 at. %. Further, the concentration of Sn in GeSn can be between about 5 at. % and about 10 at. %. The aforementioned dopant and atomic concentrations are exemplary and not intended to be limiting. Therefore, different dopant and atomic concentrations are within the spirit and the scope of the embodiments described herein.

The first epitaxial layer may be grown, for example, by sequential deposition and etching operations to produce a crystalline layer having the diamond shape shown in FIG. 4A. By way of example and not limitation, first epitaxial layer can be deposited by chemical vapor deposition (CVD) at temperatures of about 680° C. for Si:P and Si:As, between about 600° C. and about 700° C. for Si:C, about 620° C. for SiGe, between about 300° C. and about 400° C. for GeSn, and between about 500° C. and about 600° C. for Ge.

In some embodiments, first epitaxial layer of operation 240 may include one or more layers with different dopant concentrations and/or different atomic concentrations. Therefore, the term "first epitaxial layer" as used herein may apply to one or more crystalline layers formed sequentially with different dopant and/or atomic concentrations.

Referring to FIG. 2, method 200 continues with operation 250 and the process of depositing an amorphous or polycrystalline layer on the surfaces of the first epitaxial layer not covered by fin spacer structures 160. In some embodiments, the purpose of the amorphous or polycrystalline layer is to provide a non-crystalline foundation that allows a subsequently formed crystalline layer to grow substantially "facet-free" with an angle θ greater than about 55°. In other words, the amorphous or polycrystalline layer eliminates the growth rate difference between the different facets and allows the growth of a substantially facet-free epitaxial layer. In some embodiments, FIG. 4B shows the resulting structure where amorphous or polycrystalline layer $110_A$ is deposited on exposed surfaces of the first epitaxial layer.

In some embodiments, amorphous or polycrystalline layer $110_A$ is deposited at a thickness between about 1 nm and about 5 nm. At thicknesses below about 1 m, amorphous or polycrystalline layer $110_A$ may not be thick enough to eliminate the growth rate difference between the different facets and allow the growth of a substantially facet-free epitaxial layer. In other words, for amorphous or polycrystalline layer thinner than about 1 nm, the subsequently formed second epitaxial layer may continue to form facets like the first epitaxial layer. On the other hand, thicknesses greater than about 5 nm may compromise the stress induced to the channel region by the first and second epitaxial layers of the S/D epitaxial structure. In some embodiments, the thickness of amorphous or polycrystalline layer $110_A$ is different on the upper facets 400 of diamond $110_C$ compared to the lower facets 400. In some embodiments, the thickness of amorphous or polycrystalline layer $110_A$ on the lower facets of diamond 110C can range from about 2 nm to about 5 nm.

In some embodiments, amorphous or polycrystalline layer $110_A$ includes the same materials included in the first epitaxial layer. For example, if the first epitaxial layer includes Si:C, Si:P, or Si:As, then amorphous or polycrystalline layer $110_A$ respectively includes Si:C, Si:P, Si:As. If the first epitaxial layer includes SiGe, Ge, or GeSn, then amorphous or polycrystalline layer $110_A$ respectively includes SiGe, Ge, or GeSn. In some embodiments, the dopant concentration between the first epitaxial layer and amorphous or polycrystalline layer $110_A$ can be different. For example, amorphous or polycrystalline layer $110_A$ may include a higher dopant concentration for P or B. By way of example and not limitation, for a Si:P amorphous or polycrystalline layer $110_A$, the P dopant concentration can be about $5\times10^{21}$ atoms/cm$^3$ as opposed to about $3\times10^{21}$ atoms/cm$^3$ for the first epitaxial layer. For a SiGe amorphous or polycrystalline layer $110_A$, the B dopant concentration can be greater than about $3\times10^{21}$ atoms/cm$^3$ as opposed to about $1\times10^{21}$ atoms/cm$^3$ for the first epitaxial layer.

In some embodiments, amorphous or polycrystalline layer $110_A$ is grown in-situ with the first epitaxial layer using the same precursors and reactant gases. In some embodiments, amorphous or polycrystalline layer $110_A$ is grown at a lower temperature and higher process pressure than that of the first epitaxial layer. More specifically, amorphous layers can be grown at lower temperatures and higher process pressures than polycrystalline layers, and polycrystalline layers can be grown at lower temperatures and higher process pressures than crystalline epitaxial layers. In other words, the deposition temperature for amorphous, polycrystalline, and crystalline epitaxial layers follows the trend below:

$$T_{amorphous} < T_{polycrystalline} < T_{crystalline}$$

and the process pressure for amorphous, polycrystalline, and crystalline epitaxial layers follows the trend below:

$$P_{amorphous} > P_{polycrystalline} > T_{crystalline}$$

By way of example and not limitation, if the deposition temperature of a crystalline GeSn layer is between about 300° C. and 400° C., polycrystalline GeSn can be deposited at temperatures between about 200° C. and 300° C., and amorphous GeSn can be deposited below 200° C. Likewise, if the deposition temperature for crystalline Si:C is between about 600° C. and 750° C. and the process pressure between about 20 Torr and about 200 Torr, polycrystalline Si:C can be deposited between about 550° C. and 600° C. at a process pressure between about 200 Torr and about 300 Torr, and amorphous Si:C can be deposited below 550° C. at a process pressure above about 300 Torr. In some embodiments, the deposition temperature is sufficient to modulate the crystalline microstructure of the deposited layer. In some embodiments, other process parameters, such as precursor/reactant gas flow ratios, can be used to modulate other physical properties of the deposited layers such as the stoichiometry and/or the density. In some embodiments, the crystalline, polycrystalline, and amorphous layers described herein are grown with a rapid thermal chemical vapor deposition (RTCVD) process that allows rapid deposition temperature changes (e.g., within about 10 s to about 20 s) so that layers with desired crystalline microstructure can be grown in-situ—for example, without a vacuum break between depositions.

Referring to FIG. 2, method 200 continues with operation 260 and the process of growing a second epitaxial layer on amorphous or polycrystalline layer $110_A$. In some embodiments, FIG. 4C shows the resulting structure, where second epitaxial layer $110_D$ is grown on amorphous or polycrystalline layer $110_A$. In some embodiments, second epitaxial layer $110_D$ is a crystalline layer similar to the first polycrystalline layer that forms diamond $110_C$. In some embodiments, second epitaxial layer $110_D$ and first epitaxial layer have different Ge concentrations, Sn concentration, and/or C concentrations to induce different amounts of stress in the channel region. For example, in PFETs, higher strain is achieved with higher Sn or Ge concentrations—for example, for Sn or Ge concentrations between about 5% and 10%, or higher. Accordingly, higher C concentrations increase the amount of stress induced in the channel region for NFETs.

In some embodiments, the first epitaxial layer, amorphous or polycrystalline layer $110_A$, and second epitaxial layer $110_D$ collectively form S/D epitaxial structure 110 shown in FIGS. 1 and 4C. In some embodiments, due to the presence of amorphous or polycrystalline layer $110_A$, second epitaxial layer $110_D$ is grown so that S/D epitaxial structure 110 develops an enlarged top surface $110_T$ having a width along the x-direction. By way of example and not limitation, the width of top surface 110t can be grown to be between about 1 and about 1.5 times width $110_{CW}$ of diamond $110_C$.

In some embodiments, the width of top surface $110_T$ can be about 3 to 4 times larger than the top surface of a similarly sized, diamond shaped S/D epitaxial structure. For example, assuming that a diamond shaped S/D epitaxial structure, like diamond $110_C$, is allowed to grow to a size similar to S/D epitaxial structure 110, a ratio between $110_T$ and $110_{CT}$ can be between about 3 and about 4 (e.g., $3 \leq 110_T/110_{CT} \leq 4$). In some embodiments, a ratio between $110_T$ and $110_{CW}$ is between about 1 and about 1.5 (e.g., $1 \leq 110_T/110_{CW} \leq 1.5$). Consequently, S/D epitaxial structure 110 provides a large surface area between the S/D epitaxial structure and a subsequently formed S/D contact structure.

Due to the presence of amorphous or polycrystalline layer $110_A$, S/D epitaxial layer $110_D$ is grown with less pronounced facets and features a more rounded shape compared to a diamond shaped S/D epitaxial structure. S/D epitaxial structure 110 may be referred to as "substantially facet-free" S/D epitaxial structure.

In some embodiments, additional stress can be induced to the channel region formed within fin 120 covered by gate stack 150 shown in FIG. 1 as a result of the substantially facet-free shape of the S/D epitaxial structure 110. For example, the stress improvement can range between about 0.1 GPa and about 0.6 GPa. In some embodiments, the aforementioned stress improvement corresponds to a stress induced to a top portion of un-recessed fin 120 covered by gate stack 150 as shown in FIG. 1.

In some embodiments, variations of method 200 are possible. For example, in such a variation, during operation 240 shown in FIG. 2, bottom portion 110a is not permitted to grow higher than fin spacer structures 160 as shown in FIG. 5A. For example, the growth of bottom portion $110_B$ is terminated when bottom portion 110 reaches the top surface of fin spacer structures 160. Subsequently, in operation 250, amorphous or polycrystalline layer $110_A$ is formed on a top surface of bottom portion 110 instead of diamond $110_C$ shown in FIG. 4B. As a result, amorphous or polycrystalline layer $110_A$ will grow to a rounded shape as shown in FIG. 5A.

In subsequent operation 260, second epitaxial layer $110_D$ is grown on amorphous or polycrystalline layer $110_A$. Second epitaxial layer $110_D$ can be grown with a more pronounced round profile compared to second epitaxial layer $110_D$ shown in FIG. 4C. Consequently, the resulting S/D epitaxial structure 110' will be more rounded than S/D epitaxial structure 110 shown in FIG. 4C. In some embodiments, S/D epitaxial structure 110' has a larger top width $110'_T$ along the x-axis than that of S/D epitaxial structure 110 (e.g., $110'_T > 110_T$) by an amount between about 2 nm and about 5 nm. A larger top surface width $110'_T$ facilitates the formation of the S/D contact and reduces the contact resistance.

Figure 5B:
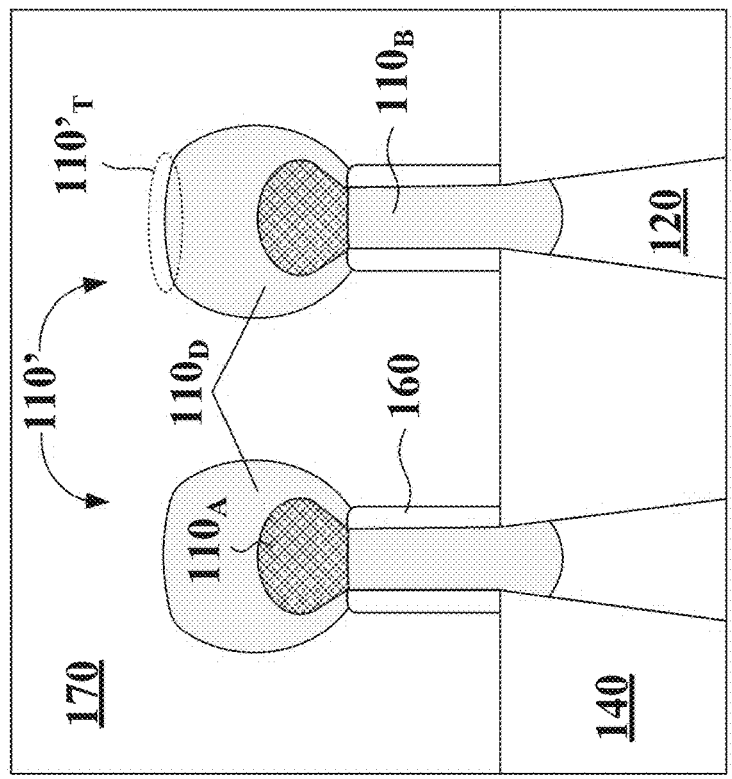
FIGS. 5A and 5B are cross-sectional views of a fabrication sequence for forming source/drain epitaxial stacks with an enlarged top surface, in accordance with some embodiments.
Figure 5A:
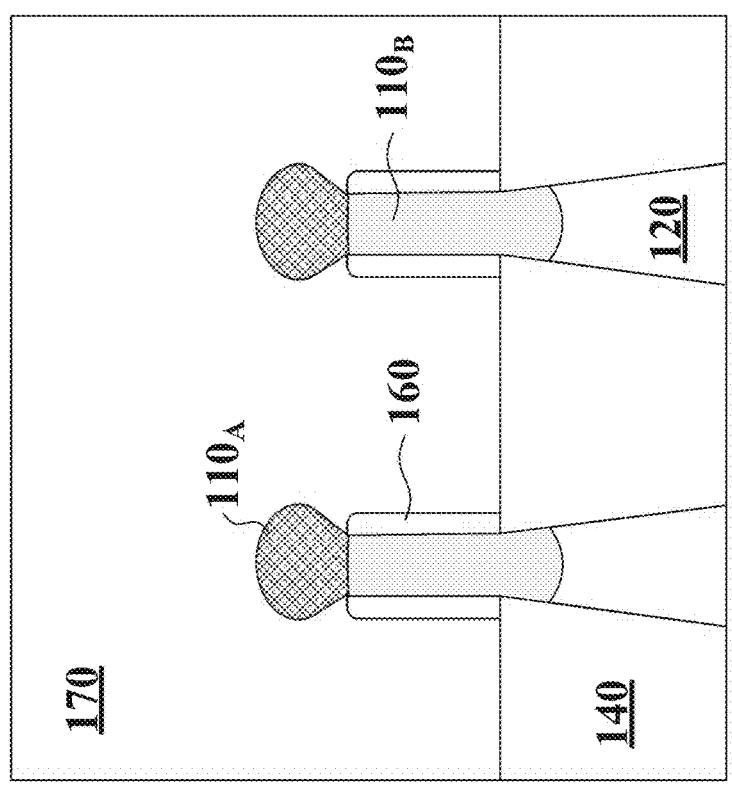
Figure 6:
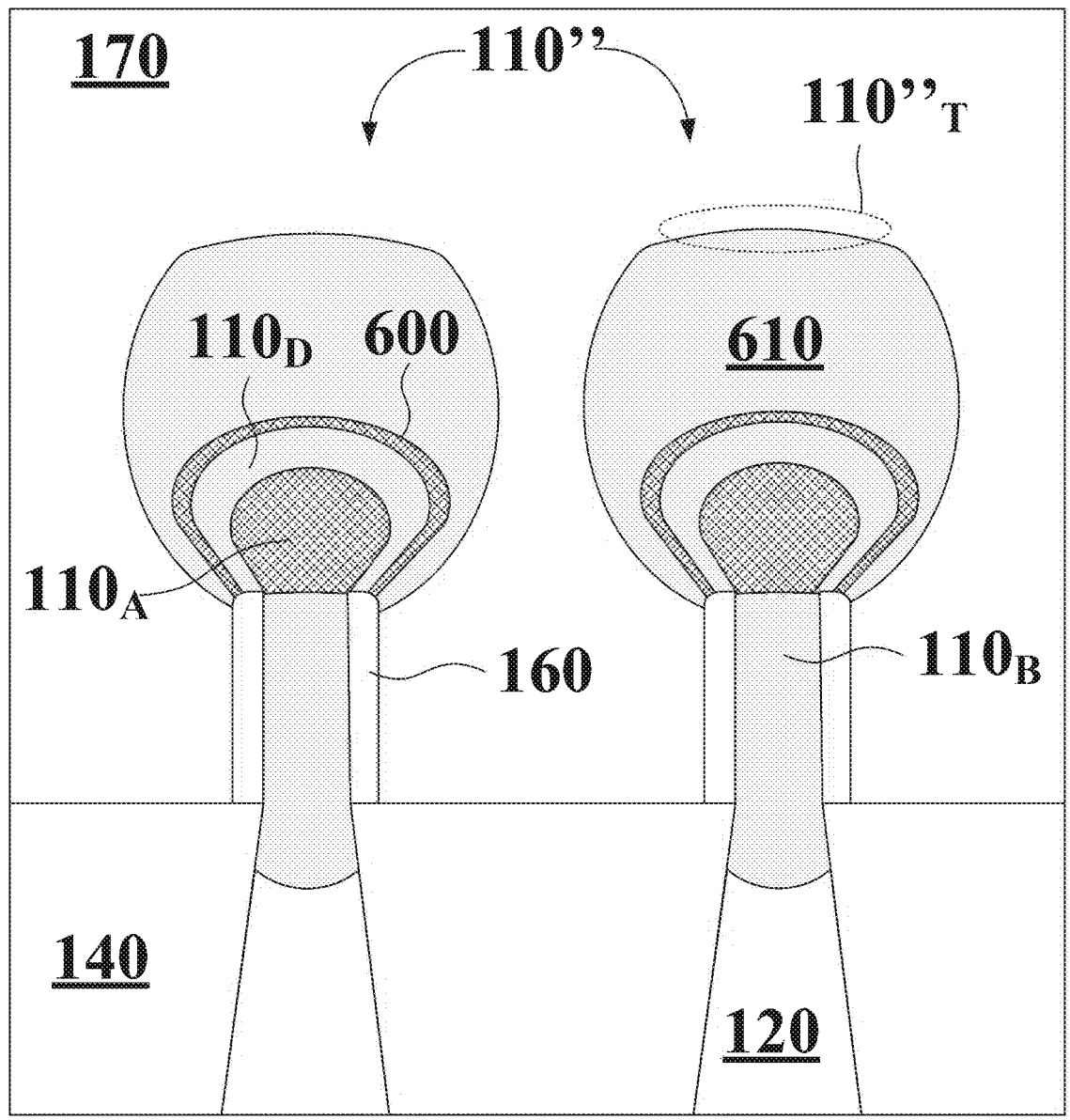
FIG. 6 is a cross-sectional view of source/drain epitaxial stacks with an enlarged top surface, in accordance with some embodiments.

In yet another variation of method 200, after forming amorphous or polycrystalline layer $110_A$ shown in FIG. 5A, the subsequent second epitaxial layer $110_D$ is not allowed to grow to its full thickness but instead it is grown thinner as shown in FIG. 6. In some embodiments, the thickness of epitaxial layer $110_D$ is limited to less than about 10 nm. Subsequently, a second amorphous or polycrystalline layer 600 is grown on second epitaxial layer $110_D$ at a thickness between about 2 nm and about 5 nm. Finally, a third epitaxial layer 610 is grown on the second amorphous or polycrystalline layer 600 to form S/D epitaxial structure 110" shown in FIG. 6.

In some embodiments, top surface width $110"_T$ of S/D epitaxial structure 110" along the x-direction is larger than that of S/D epitaxial structures 110' and 110 shown respectively in FIGS. 5B and 4C. In other words, $110"_T > 110'_T > 110_T$. Further, the stress induced to the channel region by S/D epitaxial structure 110" can be larger than the stress induced by S/D epitaxial structures 110' and 110 and can also extend to a larger area of the channel region. In some embodiments, the stress benefit of S/D epitaxial structure 110" can be closer to about 0.6 GPa. In some embodiments, S/D epitaxial structure 110" has the least amount of {111} facets compared to S/D epitaxial structures 110' and 110 shown respectively in FIGS. 4C and 5B due to the increased number of the intervening amorphous or polycrystalline layers $110_A$ and 600 used in the formation of S/D epitaxial structure 110".

Embodiments described herein are directed to forming S/D epitaxial structures with an enlarged top surface that increases the effective contact area between a S/D contact and the S/D epitaxial structure. In some embodiments, a polycrystalline or amorphous layer having a thickness between about 3 nm and about 5 nm can be introduced to inhibit the diamond-like growth of the S/D epitaxial structure and promote the formation of a S/D epitaxial stack with enlarged top surface. In some embodiments, more than one polycrystalline or amorphous layer can be introduced during the S/D epitaxial structure formation. The S/D epitaxial structures described herein are suitable for both p-type FETs (PFETs) and n-type FETs (NFETs). Further, S/D epitaxial structures grown with the method described herein may induce additional stress to the transistor's channel region compared to conventional diamond-shaped S/D epitaxial structures, in which such additional stress improves transistor performance. In some embodiments, the polycrystalline or amorphous layer for S/D epitaxial structures used in PFETs can include B-doped SiGe, B-doped Ge, B-doped GeSn, or combinations thereof. Accordingly, the polycrystalline or amorphous layer for S/D epitaxial structures used in NFETs can include As- or P-doped Si, Si:C, or combinations thereof.

In some embodiments, a semiconductor structure includes a substrate with a fin thereon, where the fin comprises a first fin portion shorter than a second fin portion. The semiconductor structure further includes a dielectric layer adjacent to the fin, where the dielectric layer surrounds a bottom portion of the second fin portion and sidewalls of the first fin portion and is taller than the first fin portion. The semiconductor structure also includes a gate stack on the second fin portion not covered by the dielectric layer and an epitaxial stack grown on a top surface of the first fin portion, wherein the epitaxial stack abuts the gate stack and includes a first crystalline epitaxial layer comprising facets; a non-crystalline epitaxial layer on the first crystalline layer; and a second crystalline epitaxial layer on the a non-crystalline epitaxial layer, where the second crystalline epitaxial layer is substantially facet-free.

In some embodiments, a method includes forming spaced apart fins on a substrate; forming a dielectric layer on the substrate to surround a bottom portion of the fins; forming a gate stack over the fins; forming spacers on sidewall surfaces of the fins not covered by the gate stack; etching portions of the fins not covered by the gate stack to recess the fins with respect to the spacers and the dielectric layer; growing a first epitaxial layer on top surfaces of the etched fins between the spacers; growing a second epitaxial layer on surfaces of the first epitaxial layer not covered by the spacers, where the second epitaxial layer has a different crystalline microstructure from the first epitaxial layer and is substantially facet-free. The method further includes growing a third epitaxial layer on the second epitaxial layer, where the third epitaxial layer is substantially facet-free and has a similar crystalline microstructure as the first epitaxial layer.

In some embodiments, a method includes forming spaced apart fins on a substrate; forming a dielectric layer on the substrate to surround a bottom portion of the fins; forming a gate stack over the fins; forming spacers on sidewall surfaces of the fins not covered by the gate stack; etching portions of the fins not covered by the gate stack to recess the fins with respect to the spacers and the dielectric layer.

The method further includes forming a source/drain epitaxial stack on etched portions of the fins, where forming the source/drain epitaxial stack includes growing a first epitaxial layer on the etched fins, growing a second epitaxial layer on surfaces of the first epitaxial layer at a lower temperature than that of the first epitaxial layer, and growing a third epitaxial layer on surfaces of the second epitaxial layer at a higher temperature than that of the second epitaxial layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a fin comprising first and second fin portions disposed on the substrate, wherein the first fin portion is shorter than the second fin portion;
   a dielectric layer disposed adjacent to the fin, wherein the dielectric layer surrounds a bottom portion of the second fin portion and sidewalls of the first fin portion, and wherein the dielectric layer is taller than the first fin portion;
   a gate stack disposed on the second fin portion uncovered by the dielectric layer; and
   an epitaxial stack disposed on the first fin portion, wherein the epitaxial stack abuts the gate stack and comprises:
      a first crystalline epitaxial layer comprising facets disposed on the first fin portion;
      a non-crystalline layer disposed on the first crystalline layer; and
      a second crystalline epitaxial layer disposed on the non-crystalline layer, wherein the second crystalline epitaxial layer is substantially facet-free.

2. The semiconductor structure of claim 1, wherein the non-crystalline layer comprises an amorphous or polycrystalline microstructure.

3. The semiconductor structure of claim 1, wherein the first crystalline epitaxial layer comprises:
   a diamond-shape with the facets parallel to {111} silicon crystal planes;
   a width in a direction perpendicular to {110} silicon crystal planes; and
   a top surface formed by adjoining facets.

4. The semiconductor structure of claim 3, wherein a ratio between a width of a top surface of the second crystalline epitaxial layer and the width of the first crystalline epitaxial layer is between about 1 and about 1.5.

5. The semiconductor structure of claim 3, wherein a width in a direction perpendicular to {110} silicon crystal planes of a top surface of the second crystalline epitaxial layer is equal to or greater than the width of the first crystalline epitaxial layer.

6. The semiconductor structure of claim 1, wherein the non-crystalline layer has a thickness between about 1 nm and about 5 nm.

7. The semiconductor structure of claim 1, wherein the epitaxial stack comprises boron-doped (B-doped) silicon-germanium (SiGe), B-doped germanium (Ge), B-doped germanium-tin (GeSn), or combinations thereof.

8. The semiconductor structure of claim 1, wherein the epitaxial stack comprises arsenic (As) doped silicon or phosphorous (P) doped silicon (Si), carbon-doped silicon (Si:C), or combinations thereof.

9. The semiconductor structure of claim 1, further comprising spacers disposed on the dielectric layer and adjacent to a bottom portion of the first crystalline epitaxial layer.

10. A semiconductor structure, comprising:
    a fin structure on a substrate and comprising a first portion and a second portion on the first portion;
    a dielectric layer on sidewall surfaces of the fin structure, wherein the first portion of the fin structure is recessed in the dielectric layer;
    a first crystalline epitaxial layer on the second portion of the fin structure;
    a non-crystalline epitaxial layer on the first crystalline layer; and
    a second crystalline epitaxial layer on the non-crystalline epitaxial layer.

11. The semiconductor structure of claim 10, wherein the non-crystalline epitaxial layer comprises an amorphous or polycrystalline microstructure.

12. The semiconductor structure of claim 10, wherein the non-crystalline epitaxial layer has a thickness between about 1 nm and about 5 nm.

13. The semiconductor structure of claim 10, wherein the second crystalline epitaxial layer is facet-free.

14. The semiconductor structure of claim 10, wherein an area of a top surface of the second crystalline epitaxial layer is greater than an area of a top surface of the first crystalline epitaxial layer.

15. The semiconductor structure of claim 10, wherein the second crystalline epitaxial layer has a greater concentration of germanium, tin, or carbon than that of the first crystalline epitaxial layer.

16. A semiconductor structure, comprising:
    a fin structure on a substrate;
    a gate structure over a channel region of the fin structure;
    a source/drain (S/D) structure on the fin structure and adjacent to the gate structure, comprising:
       a first portion on a top surface of the fin structure, wherein the first portion is crystalline and confined by a spacer structure;
       a second portion on the first portion, wherein the second portion is crystalline and has a diamond shape;
       a non-crystalline epitaxial layer over the second portion; and
       a third portion on the non-crystalline epitaxial layer, wherein an area of a top surface of the third portion is greater than an area of a top surface of the second portion.

17. The semiconductor structure of claim 16, wherein the third portion has a rounded shape.

18. The semiconductor structure of claim 16, wherein the S/D structure induces an additional stress to channel region, wherein the additional stress is between about 0.1 GPa and 0.6 GPa.

19. The semiconductor structure of claim 16, wherein a dopant concentration of the non-crystalline epitaxial layer is greater than a dopant concentration of the second portion.

20. The semiconductor structure of claim 16, wherein a ratio of the area of the top surface of the third portion and the area of the top surface of the second portion is between about 3 and about 4.

* * * * *